United States Patent [19]

Smith

[11] 4,174,566
[45] Nov. 20, 1979

[54] INSERTION TOOL FOR INTEGRATED CIRCUIT PACKAGES

[75] Inventor: John G. Smith, Erdenheim, Pa.

[73] Assignee: Burroughs Corporation, Detroit, Mich.

[21] Appl. No.: 910,657

[22] Filed: May 30, 1978

[51] Int. Cl.² .................................................. H05K 13/04
[52] U.S. Cl. ............................................... 29/758; 29/740
[58] Field of Search .................. 29/758, 740, 741, 764

[56] References Cited

U.S. PATENT DOCUMENTS 4,033,032  7/1977  Romania et al. ....................... 29/764

Primary Examiner—Carl E. Hall
Attorney, Agent, or Firm—Francis A. Varallo; Leonard C. Brenner; Kevin R. Peterson

[57] ABSTRACT

A tool is described for the holding and insertion of integrated circuit (IC) packages of the type having a metallic heat sink member fused to the chip-enclosing ceramic body. The heat sink member includes a locator or registration hole. The tool finds particular application in connection with a patented high package density island configuration wherein each IC package is secured by means of the registration hole on a retention post of a connector which is mounted between, and in close proximity to, adjacent parallel sections of the island cooling frame. The IC package heat sink member has at least one integral extension adapted to contact the frame. In performing its holding and insertion function, the tool is capable of engaging the sides of the registration hole. The assembler may then convey the IC package to the connector in which it is to be mounted, and positions the hole above the connector retention post. The application of pressure upon the tool directed substantially perpendicular to the connector, inserts the chip into the connector body and onto the retention post. The tool is then withdrawn. The entire operation requires no actual digital contact with the package by the assembler.

9 Claims, 5 Drawing Figures

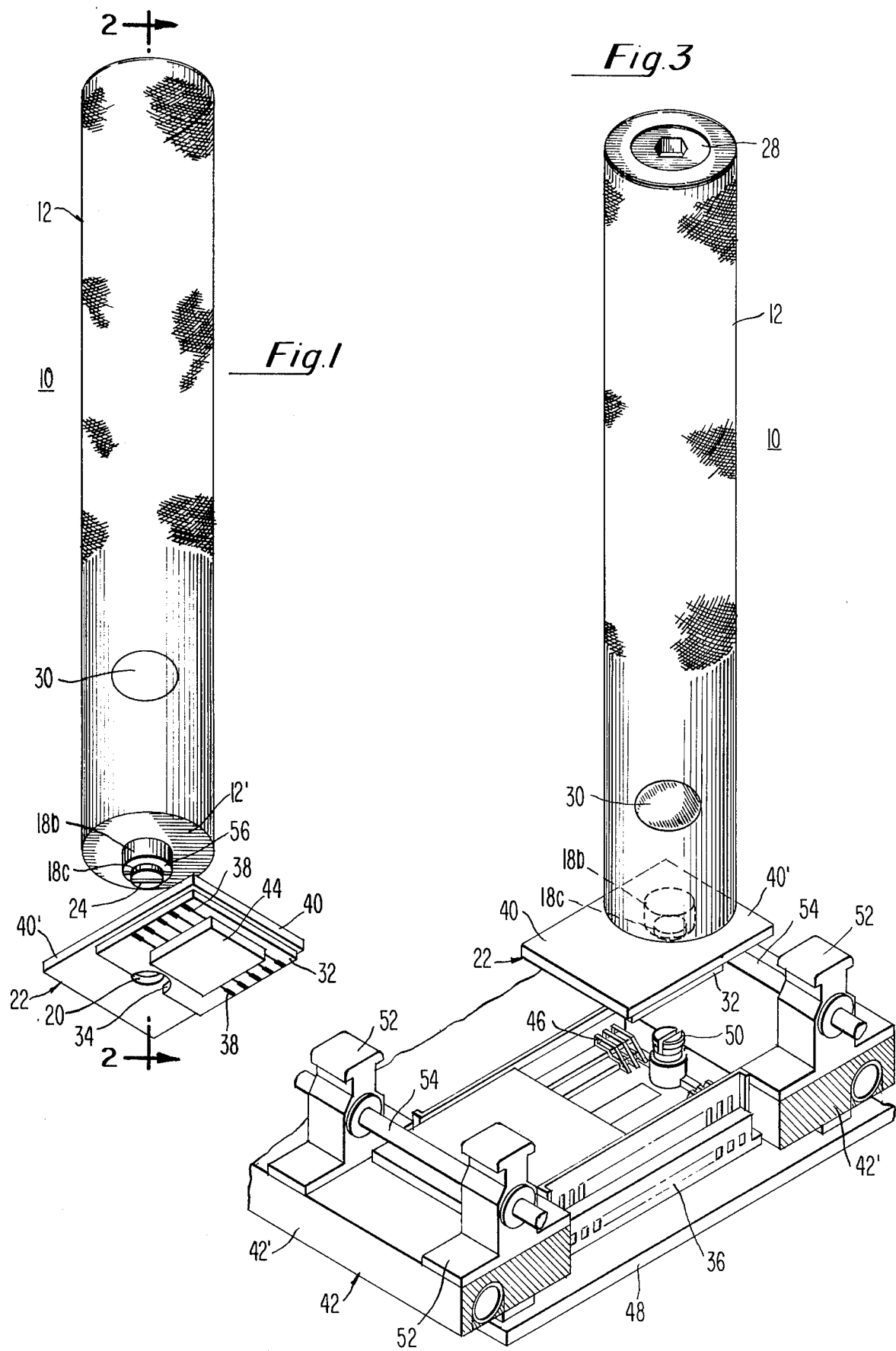

INSERTION TOOL FOR INTEGRATED CIRCUIT PACKAGES

CROSS REFERENCE TO RELATED APPLICATIONS

The IC insertion tool of the present invention finds particular application in the high density packaging system described and claimed in application Ser. No. 513,283, which issued as U.S. Pat. No. 3,946,276 in the names of Robert E. Braun et al. and is entitled "Island Assembly Employing Cooling Means for High Density Integrated Circuit Packaging". Another application, indirectly related to the present invention, involves a removal tool for use with the same type of IC packages mounted in the aforementioned system. The latter application, Ser. No. 751,176 has issued as U.S. Pat. No. 4,033,032 in the name of Samuel R. Romania et al., and is entitled "Integrated Circuit Package Removal Tool." Both patents are assigned to the same assignee as the present application.

BACKGROUND OF THE INVENTION

In the reference Braun et al. patent there is described and claimed a system which provides for high density packaging of electronics equipment in an island configuration. Integrated circuit packages of the "leadless" variety, each having a heat sink member with at least one integral extension at an extremity thereof, are installed in receptacles or connectors. The package is located in the connector by means of a registration hole in the heat sink and a retention post within the connector. The connectors themselves are mounted on an interconnection medium and lie between, and in close proximity to, adjacent parallel sections of a cooling frame fastened to the interconnection medium. When installed in the connector, the IC package heat sink extension contacts the cooling frame section.

The insertion of the IC package into the connector may be accomplished by an assembler without the aid of tools. However, it has been found that the handling of the gold plated package "leads" with the fingers results in contamination and subsequent poor circuit operation, while the use of gloves by an assembler makes the mounting of the packages considerably more arduous.

Even though the heat sink member extends beyond the connector body, mechanical holding devices which grasp the extended portions of the periphery of the heat sink are unusable due to the surrounding structures in a fully assembled island. For example, in addition to the aforementioned cooling frame sections, pairs of elevated spaced-apart brackets are fastened to the cooling frame at respective opposite sides of the area on the cooling frame contacted by the heat sink portion of the mounted IC package. These brackets form part of a package hold-down assembly. Vacuum-actuated tools may be used for holding an IC package during assembly but these are unwieldly and undesirable from a production standpoint because they require a vacuum source, hose connections to the tool and valves which must be manipulated by the assembler for alternately applying and removing the vacuum forces.

What is required for the high volume assembly of IC packages into their associated connectors is a simple, yet efficient, low-cost tool for both the transfer of IC packages from a storage or dispensing location to the connector, and the insertion thereinto. The present invention fills this need.

SUMMARY OF THE INVENTION

In accordance with the present invention a tool is provided for lifting and holding an IC package and for inserting the latter into a mating connector. The tool comprises a body portion for holding a spring-loaded pin assembly. The tip of the pin member is sized to fit the registration hole in the IC package heat sink, and is split to permit a tight spring-fit engagement with the sides of the hole. A shoulder portion below the tip limits the insertion depth which is chosen to be less than the thickness of the heat sink material. Friction means, provided within the tool body and directed against the pin member may be applied if desired by the assembler to assist the compressive spring force on the pin tip, as the latter is pushed into the registration hole.

In using the tool, the assembler places the tip within the registration hole, and carries the package by means of the tool to the connector in which it is to be mounted. The connector includes a split plastic retention post. The tool and package are oriented such that the registration hole is directly over the retention post. The top of the post enters the portion of the registration hole not occupied by the tool tip, thereby helping to properly position the package. The assembler now pushes the tool body toward the connector. The top portion of the connector retention post is contracted to allow its passage through the heat sink registration hole. As the retention post contacts the tool tip, the latter is retracted into the tool body permitting the retention post to follow. The substantially greater surface area of an extremity of the tool body is now brought to bear against the heat sink, causing the package to be seated against the connector electrical contacts. The assembler then removes the tool and the IC package is held in place by the retention post which has expanded to its original dimension.

The present invention provides a highly effective tool characterized by simplicity and low cost of construction. Other features and advantages of the invention will become more fully apparent in the detailed description of the tool and its mode of operation which follows.

BRIEF DESCRIPTION OF THE DRAWING

FIG. 1 is a pictorial view of the insertion tool of the present invention, and an IC package.

FIG. 3 illustrates the initial stage of holding the IC package in preparation for inserting the latter into a mating connector situated in an island configuration.

DESCRIPTION OF THE PREFERRED EMBODIMENT

Figure 4:
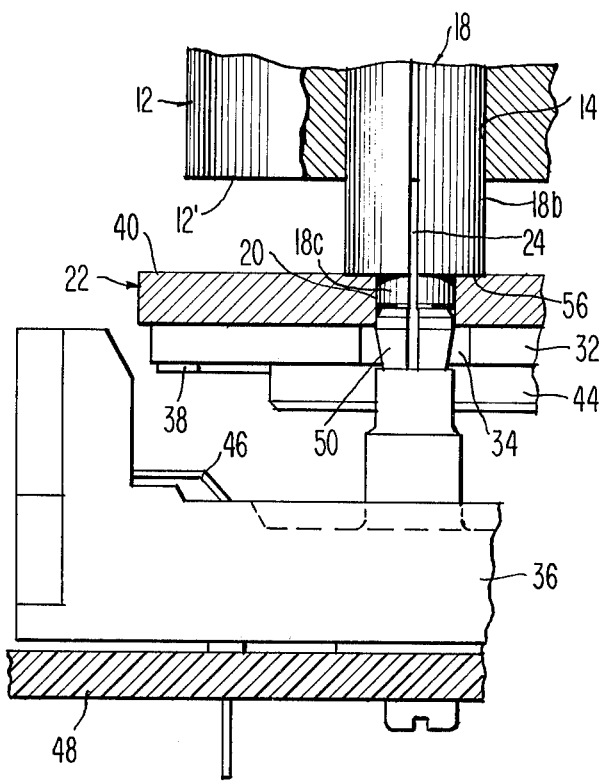
FIG. 4 depicts the orientation of the tool and package with respect to the connector retention post just prior to the actual insertion of the package.

A pictorial view of the IC package insertion tool 10 of the present invention appears in FIG. 1. The internal tool structure is apparent in the section view of FIG. 2. With reference to both FIGS. 1 and 2, the tool 10 is comprised of a body 12 having a pair of contiguous concentric bores 14 and 16, the former being of lesser diameter than the latter. A pin member 18 is provided which is comprised of three contiguous cylindrical sections 18a, 18b and 18c. A relatively large diameter section 18a at one pin member extremity is adapted to be accommodated by the bore 16 and a central elongated section 18b of lesser diameter, by bore 14. The opposite pin member extremity is comprised of a small diameter tip section 18c, sized to fit the registration hole 20 of the IC package 22. The tip 18c and adjacent portion of the central pin section 18b include a diametrical slit 24. This slit allows the tip section 18c to be contracted as it is entered into the registration hole 20 by the assembler, thereby providing a tight spring-fit between the tip surface and the sides of the hole 20. Additionally, the extremity of the tip section 18c is chamfered to facilitate the entrance operation. A helical spring 26 is also disposed in bore 16. One of the spring extremities bears against pin section 18a, while its opposite extremity contacts a set-screw 28.

Figure 2:
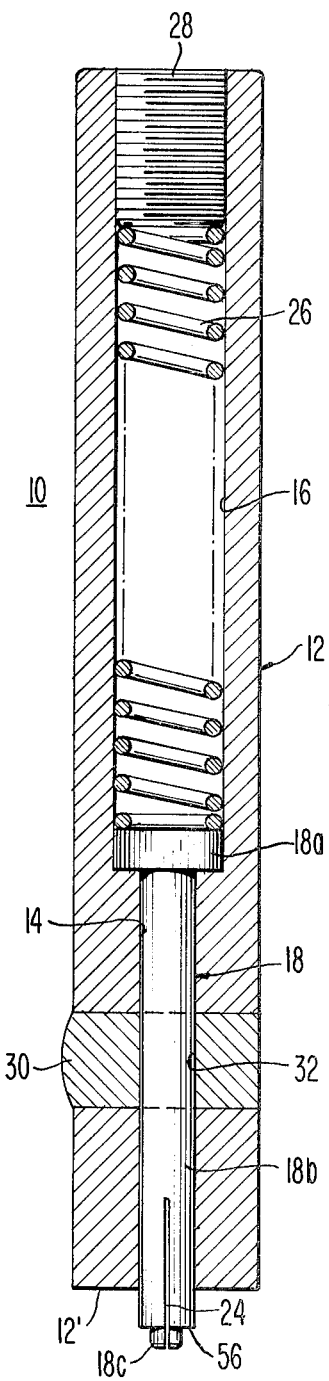
FIG. 2 is a section view taken along the lines 2—2 of FIG. 1 and depicting the internal structure of the tool body and its spring-loaded pin assembly.

It is apparent from the tool structure shown in FIG. 2 that the pin member 18 is slidably mounted within the tool body 12. The pin 18 is urged forward by the force exerted thereon by spring 26 until pin section 18a is restrained from further movement by contact with the shoulder of bore 14.

Pressure applied to the tip section 18c during the process of inserting the latter into the IC package registration hole 20 is opposed by the compressive force of spring 26. The magnitude of this force is selected to be that approximately needed for the tip insertion, but not excessive for the subsequent mounting of the package 22 into its associated connector. To assist the spring force in the former mode, a snubber 30 is provided. The snubber 30 comprises a generally cylindrical member having its longitudinal axis mounted in the tool body in a direction transverse to bore 14. Further, the snubber 30 has an aperture 32 substantially identical in diameter to that of bore 14 to permit the pin section 18b to pass therethrough. One extremity of snubber 30 conforms generally to the contour of the surface of the tool body 12; the other extremity, protrudes slightly from body 12. This latter extremity is adapted to be pressed by the assembler, if desired, during the pin tip insertion to apply a frictional force to pin section 18b. The friction aids the spring compression force and permits tip insertion without excessive retraction of the pin member 18 into the tool body 12. In practice, the assembler presses the snubber 30 while positioning the tool body 12 at substantially a right angle to the IC package 22, inserts the pin tip 18c into the registration hole 20, and then releases the snubber 30. The tool 10 with IC package 22 attached may then be moved to the site of the connector assembly.

The integrated circuit package 22 depicted in FIG. 1 is of the "leadless" variety. In general, it utilizes a ceramic body 32 having a silicon chip (not shown) hermetically sealed in a cavity formed therein. The ceramic body 32 includes a semi-circular cut-out 34 adjacent the registration hole 20, which, as will be described hereinafter, assists in properly orienting the IC package 22 prior to its insertion in the connector 36 (FIG. 3). The internal leads of the package for providing access to the chip are adhered to a layer of glass fused to the ceramic body 32. Electrical contact with the chip is made with the terminal portions of a plurality of leads 38. A metallic heat sink member 40 is fused to the entire lower surface of the ceramic body 32. The heat sink 40 has an integral extension 40' at one extremity thereof which is adapted to contact the cooling frame 42 (FIG. 3) as will be described in greater detail in connection with the last mentioned figure. A lid or cover 44 which may be of ceramic or a suitable metal alloy protects the IC chip.

In FIG. 3, the tip section 18c of tool 10 has been inserted into the registration hole 20 and the IC package 22 has been carried by the tool to the connector 36 disposed in an island assembly. The tool 10 and package 22 are depicted as having a proper initial orientation for the subsequent mounting of the package.

In order to make electrical contact with the terminal portions of the integrated circuit leads 38, connector 36 is provided. The connector 36 comprises a molded body of insulative material and a plurality of electrical contacts 46, one for each of the package terminals. The connector is affixed to an interconnection board 48, and is located between parallel spaced apart sections 42' of the island cooling frame 42. Each connector 36 has at respective opposite extremities thereof a pair of package alignment and retention posts 50. A spring hold down device (not shown) is positioned between the adjacent sections 42' of the cooling frame 42 by virtue of pairs of elevated brackets 52 fastened to the frame 42 and each group supporting a common rod 54 which passes therethrough. The close proximity of the connector extremities to the cooling frame sections 42' and the brackets 52 tend to make insertion of the IC package 22 into its associated connector 36 difficult.

In FIG. 4, the assembler has oriented the registration hole 20 in the IC package heat sink 40 directly over the connector retention post 50. This was accomplished by gently resting the heat sink 40 on top of the post 50 and moving the former until the retention post 50 is felt to start into the registration hole 20. The post 50 may enter the hole 20, because the length of the tip 18c and its depth of insertion as controlled by shoulder 56 of pin section 18b, are chosen to be less than the thickness of the heat sink 40. This leaves a space within the hole 20 adjacent the lower side of the heat sink 40 not occupied by the tip 18c. Further, the semi-circular cut-out 34 of the package ceramic material 32, as mentioned hereinbefore and seen clearly in FIG. 1, helps to guide the post 50 into the hole 20.

Figure 5:
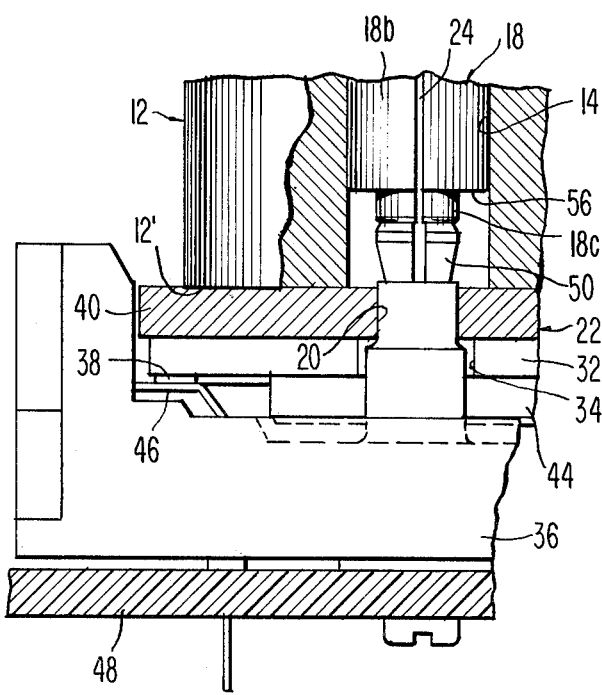
FIG. 5 illustrates the tool disposition for a fully inserted condition of the IC package within the connector.

With reference to FIG. 5, it is assumed that the assembler has exerted a pressure upon the tool body 12 in a direction substantially orthogonal to the plane of the interconnection medium 48. The split-tip of retention post 50 was gently pressed together as it passed through the hole 20. As the top of the post contacted tip 18c, pin member 18 commenced to retract into the tool body 12. The surface 12' of the forward extremity of the tool body is now brought to bear against the upper surface of heat sink 40 as seen in FIG. 5. Concurrently, the upper part of post of 50 follows into bore 14 of the tool body. Sufficient force is now applied to the IC package 22 to seat it within the connector 36—the leads 38 pressing against the connector contacts 46. The tool 10 may now be removed. The IC package 22 remains in place, and is restrained from being inadvertently dislodged from the connector 36 by the retention post 50 which has returned to its original dimensions.

In conclusion, it is submitted that the tool disclosed herein offers a low-cost, simple, timesaving means to facilitate the insertion of integrated circuit packages into connectors situated in a high density configuration. The inventive concepts and implementation described herein are directed to a specific application. In an operative embodiment, the tool body was constructed of aluminum, while the pin member was made of hardened steel. In other applications, changes and modifications of the tool, for example, as to the materials of which it is made, or the relative physical dimensions of its parts, may be needed to suit particular requirements. Such variations as are within the skill of the designer, and which do not depart from the true scope and spirit of the invention are intended to be covered by the following claims.

I claim:

1. A tool for use in inserting within a connector an integrated circuit package having a metallic heat sink member and including a registration hole therein, said connector having a retention post for engaging said registration hole, said tool comprising:

a body member, said body member having a plurality of contiguous concentric bores, one of said bores terminating in an extremity of said body member, a pin member, said pin member having a plurality of contiguous coaxial cylindrical sections, at least a first and second section being accommodated respectively within said bores, a third section contiguous with said second section and defining tip means for said pin member, said tip means for engaging said registration hole and having dimensions such that the sides of said hole are gripped by the tip surface, said pin member being slidably disposed within said body member and having said tip means and a portion of said second section adjacent thereto protruding from said extremity of said body member, and spring means positioned in one of said bores and in contact with said pin member for applying a compressive force thereto which tends to drive said pin member in the direction of said extremity of said body member.

2. A tool for use in inserting within a connector an integrated circuit package having a metallic heat sink member and including a registration hole therein, said connector having a retention post for engaging said registration hole, said tool comprising:

a body member, said body member having at least first and second contiguous concentric bores of respective different diameters, the second bore terminating in a planar surface defining the forward extremity of said body member, a pin member, said pin member having a plurality of contiguous coaxial cylindrical sections, a first and second pin member section having diameters capable of being accommodated respectively by said first and second bores, a third of said sections contiguous with said second section defining the tip of said pin member, said tip having a diameter predetermined in accordance with the diameter of said registration hole to provide a tight fit upon insertion of said tip into said hole, thereby enabling said integrated circuit package to be held by said tool, said pin member being spring-loaded within said body member and having said tip and a portion of said second section adjacent thereto protruding from said forward extremity of said body member, the integrated circuit package being held by said tool and oriented with respect to said connector such that said registration hole and retention post are in substantial coaxial alignment, the initial application of a force by said body member in the direction of said connector causing said tip to contact said retention post and to be retracted into said second bore, the continued application of said last mentioned force bringing said planar surface of the forward extremity of said body member into contact with said heat sink member and causing said retention post to enter said second bore, the insertion of said integrated circuit package into said connector being concurrently accomplished.

3. A tool as defined in claims 1 or 2 further characterized in that the diameter of said second section of said pin member is larger than that of said registration hole, the length of said tip and the depth of insertion determined by contact of said second section with said metallic heat sink member being chosen to be less than the thickness of said heat sink member.

4. A tool as defined in claim 3 further characterized in that said tip and a predetermined portion of said second section of said pin member adjacent thereto contain a common diametrical slit for providing a spring-fit engagement of the sides of said hole with the surface of said tip during the insertion of the latter.

5. A tool as defined in claim 4 wherein said first, second and third sections of said pin member have respective decreasing cross-sectional diameters.

6. A tool as defined in claim 5 further characterized in that the circumferential extremity of said tip is chamfered for ease of insertion.

7. A tool as defined in claim 6 further characterized in that said body member is constructed in one piece of aluminum and said pin member is constructed in one piece of hardened steel.

8. A tool as defined in claim 2 further characterized in that a helical spring is disposed within said first bore, the latter bore terminating at a rearward extremity of said body member, closure means for sealing said first bore at the last mentioned extremity, the opposite extremities of said spring contacting respectively said first section of said pin member and said closure means, for applying a compressive force to the former.

9. A tool as defined in claim 8 further including snubber means, said snubber means comprising a substantially cylindrical member disposed in said body member and having its longitudinal axis oriented transverse to said second bore, said snubber means having an aperture substantially identical to that of said second bore to permit said second section of said pin member to pass therethrough, at least one extremity of said snubber means being externally accessible, whereby pressure exerted thereon causes a frictional force to be exerted upon said pin member.

* * * * *